United States Patent
Agarwal et al.

(10) Patent No.: US 11,332,827 B2
(45) Date of Patent: May 17, 2022

(54) GAS DISTRIBUTION PLATE WITH HIGH ASPECT RATIO HOLES AND A HIGH HOLE DENSITY

(71) Applicant: Applied Materials, Inc., Santa Clara, CA (US)

(72) Inventors: Sumit Agarwal, Dublin, CA (US); Sanjeev Baluja, Campbell, CA (US); Chad Peterson, San Jose, CA (US); Michael R. Rice, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 91 days.

(21) Appl. No.: 16/802,293

(22) Filed: Feb. 26, 2020

(65) Prior Publication Data

US 2020/0308703 A1    Oct. 1, 2020

Related U.S. Application Data

(60) Provisional application No. 62/824,369, filed on Mar. 27, 2019.

(51) Int. Cl.
*C23C 16/40* (2006.01)
*C23C 16/455* (2006.01)
*B23K 1/00* (2006.01)

(52) U.S. Cl.
CPC ...... *C23C 16/45565* (2013.01); *B23K 1/0008* (2013.01); *C23C 16/45544* (2013.01)

(58) Field of Classification Search
CPC ........ C23C 16/45565; C23C 16/45544; B23K 1/0008
USPC .................. 118/715; 156/345.33, 345.34
See application file for complete search history.

(56) References Cited

U.S. PATENT DOCUMENTS

| | | | | |
|---|---|---|---|---|
| 4,780,169 A | * | 10/1988 | Stark | H01J 37/3244 |
| | | | | 156/345.34 |
| 5,415,753 A | * | 5/1995 | Hurwitt | C23C 14/0068 |
| | | | | 204/192.12 |
| 5,439,524 A | * | 8/1995 | Cain | C23C 16/45565 |
| | | | | 118/715 |
| 5,500,256 A | * | 3/1996 | Watabe | C23C 16/45574 |
| | | | | 427/579 |
| 5,624,498 A | | 4/1997 | Lee et al. | |
| 5,781,693 A | * | 7/1998 | Ballance | C23C 16/45565 |
| | | | | 118/724 |

(Continued)

FOREIGN PATENT DOCUMENTS

| | | | |
|---|---|---|---|
| JP | 05175135 A | * | 7/1993 |
| KR | 20180054892 A | | 5/2018 |

OTHER PUBLICATIONS

International Search Report and Written Opinion Application No. PCT/US2020/020070 dated Jun. 30, 2020 consists of 12 pages.

*Primary Examiner* — Rudy Zervigon
(74) *Attorney, Agent, or Firm* — Patterson + Sheridan, LLP

(57) ABSTRACT

A gas distribution plate for a showerhead assembly of a processing chamber may include at least a first plate and second plate. The first plate may include a first plurality of holes each having a diameter of at least about 100 um. The second plate may include a second plurality of holes each having a diameter of at least about 100 um. Further, each of the first plurality of holes is aligned with a respective one of the second plurality of holes forming a plurality of interconnected holes. Each of the interconnected holes is isolated from each other interconnected holes.

20 Claims, 8 Drawing Sheets

(56) References Cited

U.S. PATENT DOCUMENTS

| | | | | |
|---|---|---|---|---|
| 5,792,269 A * | 8/1998 | Deacon | C23C 16/45565 | 118/715 |
| 5,819,434 A * | 10/1998 | Herchen | C23C 16/45565 | 34/232 |
| 6,024,799 A * | 2/2000 | Chen | C23C 16/455 | 118/715 |
| 6,041,734 A * | 3/2000 | Raoux | C23C 16/345 | 118/723 E |
| 6,050,506 A * | 4/2000 | Guo | C23C 16/45565 | 239/558 |
| 6,051,286 A * | 4/2000 | Zhao | C23C 16/4401 | 118/723 E |
| 6,059,885 A * | 5/2000 | Ohashi | C30B 25/14 | 118/730 |
| 6,079,356 A * | 6/2000 | Umotoy | C23C 16/455 | 118/723 E |
| 6,080,446 A * | 6/2000 | Tobe | C23C 16/34 | 257/E21.168 |
| 6,098,568 A * | 8/2000 | Raoux | C23C 16/5096 | 118/723 E |
| 6,106,625 A * | 8/2000 | Koai | C23C 16/455 | 118/715 |
| 6,140,773 A * | 10/2000 | Anders | H01J 37/32009 | 315/111.21 |
| 6,203,620 B1 * | 3/2001 | Moslehi | H01J 37/321 | 118/723 R |
| 6,250,250 B1 * | 6/2001 | Maishev | H01J 37/32009 | 118/723 ER |
| 6,381,021 B1 * | 4/2002 | Somekh | G01N 21/55 | 356/445 |
| 6,388,381 B2 * | 5/2002 | Anders | H05H 1/48 | 315/111.21 |
| 6,410,089 B1 * | 6/2002 | Guo | C23C 16/45565 | 118/715 |
| 6,454,860 B2 * | 9/2002 | Metzner | C23C 16/407 | 118/715 |
| 6,461,435 B1 * | 10/2002 | Littau | C23C 16/45565 | 118/715 |
| 6,565,661 B1 * | 5/2003 | Nguyen | C23C 16/45565 | 118/715 |
| 6,761,796 B2 * | 7/2004 | Srivastava | H01J 37/32192 | 156/345.38 |
| 6,793,733 B2 * | 9/2004 | Janakiraman | C23C 16/455 | 118/715 |
| 6,800,139 B1 * | 10/2004 | Shinriki | C23C 16/45574 | 118/715 |
| 6,890,386 B2 * | 5/2005 | DeDontney | C23C 16/45572 | 118/715 |
| 6,942,753 B2 * | 9/2005 | Choi | C23C 16/45565 | 118/715 |
| 7,004,107 B1 * | 2/2006 | Raoux | C23C 16/45565 | 118/663 |
| 7,008,484 B2 * | 3/2006 | Yim | C23C 16/45565 | 118/715 |
| 7,270,713 B2 * | 9/2007 | Blonigan | C23C 16/455 | 118/715 |
| 7,429,410 B2 * | 9/2008 | Keller | H01J 37/3244 | 427/578 |
| 7,581,511 B2 * | 9/2009 | Mardian | C23C 16/045 | 118/723 ER |
| 7,819,081 B2 * | 10/2010 | Kawasaki | C23C 16/45563 | 118/723 E |
| 7,829,145 B2 * | 11/2010 | Balasubramanian | C23C 16/4405 | 427/255.28 |
| 8,083,853 B2 * | 12/2011 | Choi | H01J 37/32082 | 118/715 |
| 8,778,079 B2 * | 7/2014 | Begarney | H01L 21/67017 | 118/715 |
| 9,224,581 B2 * | 12/2015 | Mai | H01J 37/32449 | |
| 9,484,190 B2 * | 11/2016 | Glukhoy | H01J 37/3244 | |
| 10,358,722 B2 * | 7/2019 | Wiltse | C23C 16/45574 | |
| 2001/0006093 A1 * | 7/2001 | Tabuchi | C23C 16/458 | 156/345.43 |
| 2003/0106643 A1 * | 6/2003 | Tabuchi | C23C 16/24 | 156/345.35 |
| 2003/0207033 A1 * | 11/2003 | Yim | C23C 16/45565 | 427/255.37 |
| 2003/0209323 A1 * | 11/2003 | Yokogaki | C23C 16/45565 | 156/345.34 |
| 2004/0003777 A1 * | 1/2004 | Carpenter | C23C 16/45544 | 118/715 |
| 2004/0035358 A1 * | 2/2004 | Basceri | C23C 16/45565 | 118/715 |
| 2004/0058070 A1 * | 3/2004 | Takeuchi | C23C 4/01 | 427/282 |
| 2004/0129211 A1 * | 7/2004 | Blonigan | C23C 16/45565 | 118/715 |
| 2004/0140053 A1 * | 7/2004 | Srivastava | H01J 37/32192 | 156/345.39 |
| 2004/0238123 A1 * | 12/2004 | Becknell | H01J 37/3244 | 156/345.33 |
| 2005/0126487 A1 * | 6/2005 | Tabuchi | C23C 16/24 | 118/723 E |
| 2005/0223986 A1 * | 10/2005 | Choi | B05B 1/005 | 118/715 |
| 2005/0251990 A1 * | 11/2005 | Choi | H01J 37/3244 | 29/558 |
| 2005/0255257 A1 * | 11/2005 | Choi | H01L 21/0217 | 427/585 |
| 2006/0005926 A1 * | 1/2006 | Kang | H01J 37/32082 | 156/345.34 |
| 2006/0054280 A1 * | 3/2006 | Jang | C23C 16/45565 | 156/345.34 |
| 2006/0060138 A1 * | 3/2006 | Keller | H01J 37/3244 | 118/715 |
| 2006/0228490 A1 * | 10/2006 | Wang | H01J 37/3244 | 427/457 |
| 2006/0228496 A1 * | 10/2006 | Choi | H01J 37/3244 | 427/569 |
| 2006/0236934 A1 * | 10/2006 | Choi | H01J 37/3244 | 118/723 R |
| 2007/0175396 A1 * | 8/2007 | Kasai | H01J 37/3244 | 118/723 R |
| 2008/0020146 A1 * | 1/2008 | Choi | C23C 16/5096 | 427/446 |
| 2008/0141941 A1 * | 6/2008 | Augustino | H01J 37/32541 | 118/723 R |
| 2008/0178807 A1 * | 7/2008 | Wang | C23F 4/00 | 118/723 R |
| 2008/0202688 A1 | 8/2008 | Wu et al. | | |
| 2008/0264566 A1 | 10/2008 | Kim et al. | | |
| 2008/0302303 A1 * | 12/2008 | Choi | H01J 37/32449 | 118/723 R |
| 2008/0305246 A1 * | 12/2008 | Choi | H01L 31/182 | 427/74 |
| 2009/0288602 A1 * | 11/2009 | Satake | H05H 1/46 | 118/723 E |
| 2010/0006031 A1 * | 1/2010 | Choi | C23C 16/45565 | 118/723 R |
| 2012/0097330 A1 * | 4/2012 | Iyengar | C23C 16/4557 | 156/345.34 |
| 2012/0222815 A1 * | 9/2012 | Sabri | C23C 16/45565 | 156/345.34 |
| 2012/0267048 A1 * | 10/2012 | Moyama | H01J 37/32229 | 156/345.33 |
| 2012/0304933 A1 * | 12/2012 | Mai | C23C 16/5096 | 118/723 I |
| 2013/0109159 A1 * | 5/2013 | Carlson | C23C 16/45574 | 438/503 |
| 2015/0247237 A1 * | 9/2015 | Ha | C23C 16/4585 | 118/715 |
| 2015/0332893 A1 * | 11/2015 | Tabuchi | H01J 37/32715 | 156/345.33 |
| 2015/0345020 A1 * | 12/2015 | Tucker | C23C 16/4412 | 118/723 R |
| 2017/0167024 A1 * | 6/2017 | Wiltse | C23C 16/45565 | |

(56) References Cited

U.S. PATENT DOCUMENTS

\* cited by examiner

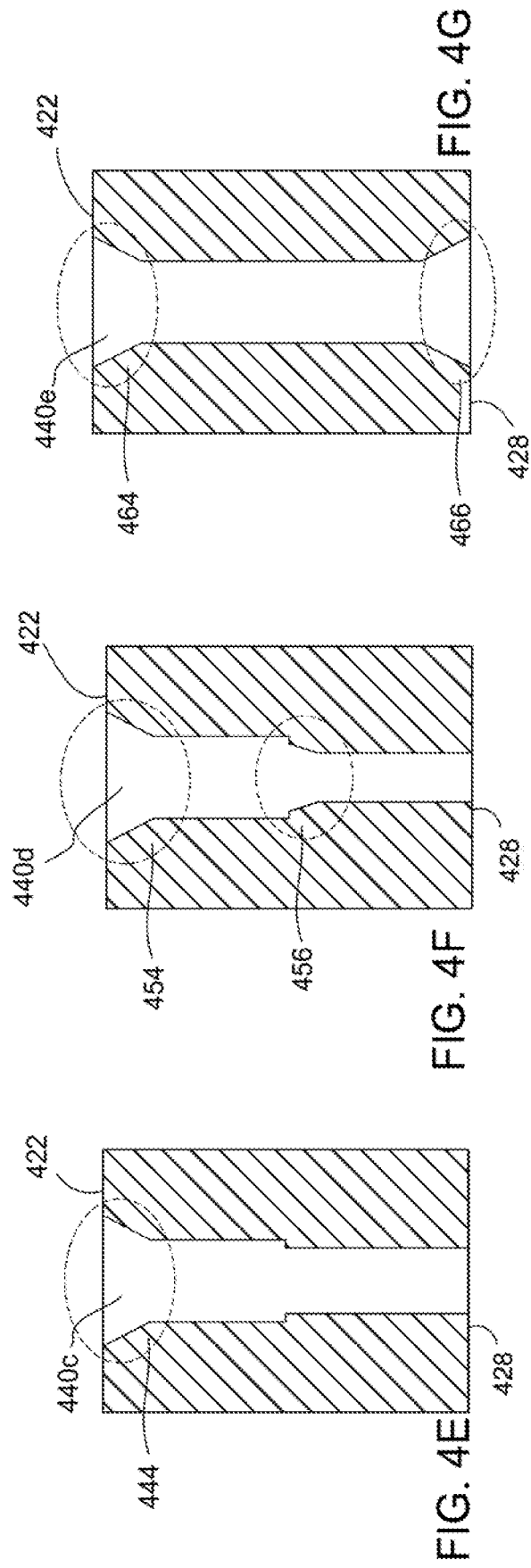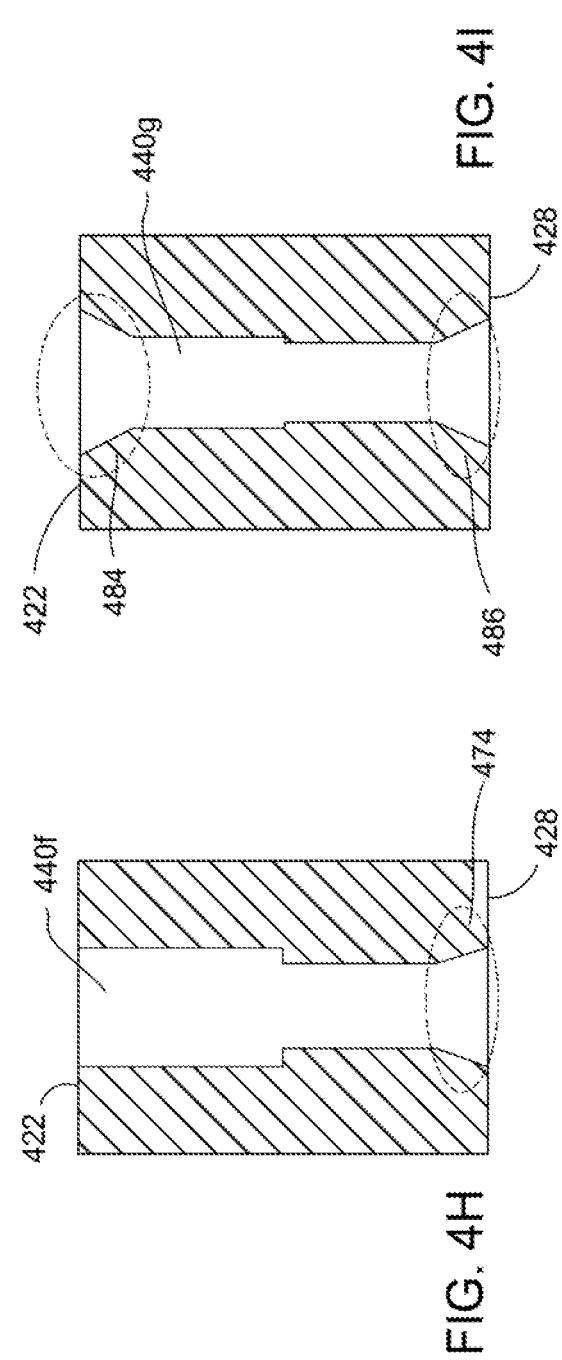

GAS DISTRIBUTION PLATE WITH HIGH ASPECT RATIO HOLES AND A HIGH HOLE DENSITY

CROSS-REFERENCE TO RELATED APPLICATIONS

This application claims priority to the U.S. Provisional Patent Application Ser. No. 62/824,369 filed Mar. 27, 2019 of which is incorporated herein by reference in its entirety.

BACKGROUND

Embodiments of the present disclosure generally relate to a showerhead for processing chambers, and, more particularly, to a showerhead having a high aspect ratio of holes and a high hole density for processing chambers.

Description of the Related Art

In many conventional showerhead designs, the showerhead includes a gas distribution plate having a plurality of holes through which a processing gas may flow. However, the number of holes and the aspect ratio of those holes may be limited. Hence, the uniformity of the flow of the processing gas through the showerhead is limited. A major factor in limiting the number of holes within a gas distribution plate is the process in which the holes are generated. For example, mechanical drilling of holes may place high levels of stress on the gas distribution plate potentially damaging the gas distribution plate and/or may create burrs within the gas distribution plate. Further, mechanical drilling is time prohibitive and may be process limited. For example, in many instances, mechanical drilling utilizes a spindle coolant fed drills, which are available in the smallest diameter size of about 500 um, limiting the smallest possible hole that may be drilled. Other subtractive drilling methods include ultrasonic drilling or micro electrical discharge machining (EDM), which are both time prohibitive. A further example of subtractive drilling includes laser drilling which is typically limited to about a 10:1 aspect ratio and which is also time prohibitive. Accordingly, the conventional methods of generating holes limit the size of the holes and the aspect ratio of the holes, while increasing the manufacturing cost of the gas distribution plate. Further, the conventional methods of holes generation limit the hole density, which limits the uniformity of a process gas flowing through the gas distribution plate.

Therefore, in order to improve the uniformity of gas distribution, there is a need for improved fabrication methods to create a large number of small diameter holes in a gas distribution plate in a cost-effective way.

SUMMARY

In one embodiment, a gas distribution plate for a showerhead assembly includes a first plate and second plate. The first plate may comprise a first plurality holes each having a diameter of at least about 100 um. The second plate may comprise a second plurality of holes each having a diameter of at least about 100 um. Further, each of the first plurality of holes is aligned with a respective one of the second plurality of holes forming a plurality of interconnected holes. Each of the plurality of interconnected holes is isolated from each other of the plurality of interconnected holes.

In one embodiment, a method for forming a showerhead comprises generating a first plurality of holes in a first plate and generating a second plurality of holes in a second plate. Each of the first plurality of holes has a diameter of at least about 100 um and each of the second plurality of holes has a diameter of about 100 um. The method further comprises aligning each of the first plurality of holes with a respective one of the second plurality of holes to generate a plurality of interconnected holes, and bonding the first plate to the second plate. Each of the plurality of interconnected holes is isolated from each other of the plurality of interconnected holes.

In one embodiment, a processing chamber comprises a showerhead assembly, a substrate support configured to support a substrate and a gas supply fluidly coupled with the showerhead assembly and configured to provide a process gas to the showerhead assembly. The showerhead assembly comprises a gas distribution plate including a first plate and second plate. The first plate comprises a first plurality holes each having a diameter of at least about 100 um. The second plate comprises a second plurality of holes each having a diameter of at least about 100 um. Further, each of the first plurality of holes is aligned with a respective one of the second plurality of holes forming a plurality of interconnected holes, and each of the plurality of interconnected holes is isolated from each other of the plurality of interconnected holes.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of scope, as the disclosure may admit to other equally effective embodiments.

FIGS. 4A, 4B, 4C, 4D, 4E, 4F, 4G, 4H, and 4I are schematic cross-sectional view of a gas distribution plate, according to one or more embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments for the present application include a gas distribution plate having high aspect ratio holes for a showerhead assembly. The gas distribution plate includes a plurality of holes through which a processing gas may flow. In many instances, by decreasing the size of each of the plurality of holes and by increasing the number of the plurality of holes, the uniformity of the process gas which is applied to a substrate during processing may also be improved. Accordingly, embodiments of the following disclosure describe a gas distribution plate having a high number of small holes and a method for generating such a gas distribution plate while maintaining sufficient thickness of the gas distribution plate for adequate strength.

Figure 1:
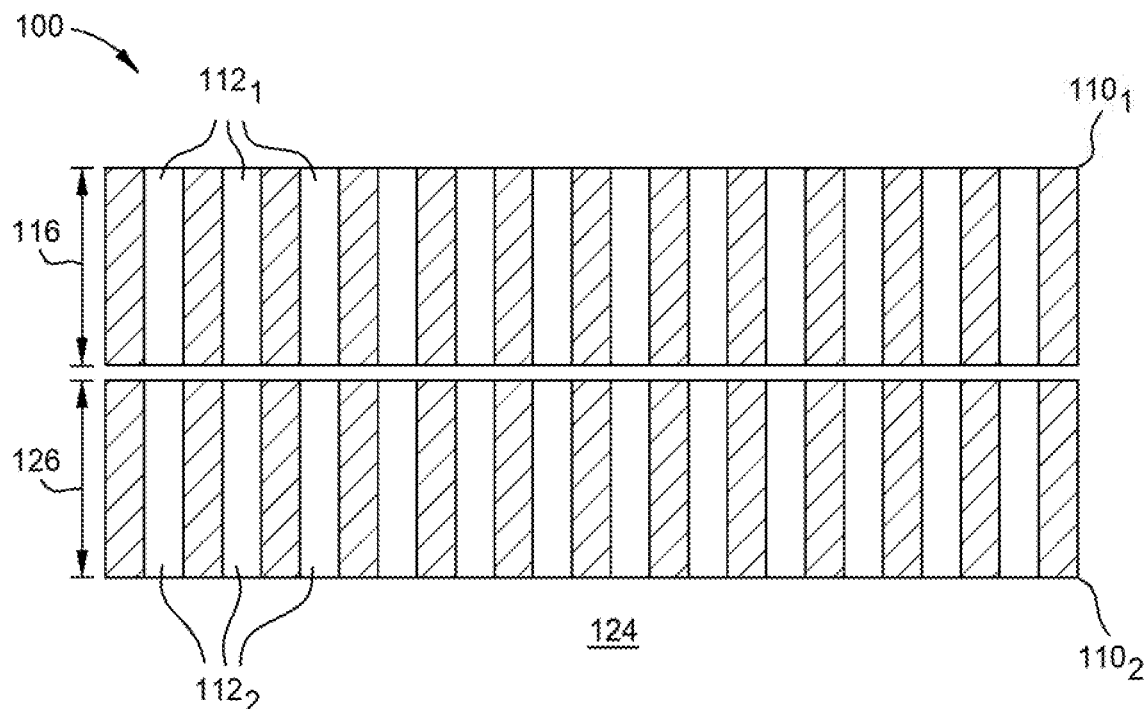
FIGS. 1 and 2A are schematic cross-sectional view of a gas distribution plate, according to one or more embodiments.

FIG. 1 illustrates a gas distribution plate 100, according to one or more embodiments. The gas distribution plate 100 includes a plate $110_1$ and a plate $110_2$. The plate $110_1$ may be connected to the plate $110_2$ forming the gas distribution plate 100. Further, the gas distribution plate 100 may be part of a showerhead assembly, e.g., the showerhead assembly 616 of FIG. 6.

The plate $110_1$ comprises holes $112_1$. Further, the plate $110_1$ may be formed of aluminum, an aluminum alloy, molybdenum, a molybdenum alloy, nickel, a nickel alloy, or silicon, among others. The number of holes $112_1$ may be about 50,000 or greater. Further, the number of holes $112_1$ may be about 100,000 or greater. The diameter of each hole $112_1$ may be at least about 100 um. Further, the diameter of each hole $112_1$ may be about 100 um to about 600 um. Alternatively, the diameter of each hole $112_1$ may be less than about 100 um or greater than about 600 um. Further, each hole $112_1$ may be of a common size (e.g., a common diameter). Alternatively, the diameter of one or more holes $112_1$ differs from the diameter of another one of the holes $112_1$.

Each of the holes $112_1$ may have a uniform diameter. For example, the aspect ratio of each of the holes $112_1$ may be substantially constant such that the diameter at any point within each hole $112_1$ is the same, or within a manufacturing tolerance, as the diameter at any other point within each hole $112_1$. Further, the size of each hole $112_1$ at a first side of the plate $110_1$ is the same, or within a manufacturing tolerance, as the size of each hole $112_1$ at a second side of the plate $110_1$. Alternatively, as will be described in greater detail with regard to the embodiment of FIG. 4C, the diameter of a hole on a first side of the plate $110_1$ may differ from the diameter of the hole on a second side of the plate $110_1$.

The thickness 116 of the plate $110_1$ may be in a range of about 200 um to about 900 um. Alternatively, the thickness 116 of the plate $110_1$ may be less than about 200 um or greater than about 900 um.

The plate $110_2$ includes holes $112_2$. The plate $110_2$ may be formed of aluminum, an aluminum alloy, molybdenum, a molybdenum alloy, nickel, a nickel alloy, or silicon, among others. Further, the plate $110_2$ may be formed of the same material as plate $110_1$ or a different material from plate $110_1$. The number of holes $112_2$ may be about 50,000 or greater. Further, the number of holes $112_2$ may be about 100,000 or greater. The number of holes $112_2$ may be the same as the number of holes $112_1$. The diameter of each hole $112_2$ may be about 100 um to about 600 um. Alternatively, the diameter of each hole $112_2$ may be less than about 100 um or greater than about 600 um. Further, each hole $112_2$ may be of a common size (e.g., a common diameter). Alternatively, the diameter of one or more holes $112_2$ differs from the diameter of another one of the holes $112_2$. Additionally, the diameter of each of the holes $112_2$ may be the same as the diameter of each of the holes $112_1$, or one or more holes $112_2$ differs from the diameter of one or more of the holes $112_1$.

Each of the holes $112_2$ may have a uniform diameter. For example, the aspect ratio of each of the holes $112_2$ may be substantially constant such that the diameter at any point of within each hole $112_2$ is the same, or within a manufacturing tolerance, as the diameter at any other point within each hole $112_2$. Further, the size of each hole $112_2$ at a first side of the plate $110_2$ is the same, or within a manufacturing tolerance, as the size of each hole $112_1$ at a second side of the plate $110_2$. Alternatively, as will be described in greater detail with regard to at least the embodiment of FIG. 4C, the diameter of a hole on a first side of the plate $110_1$ may differ from the diameter of the hole on a second side of the plate $110_1$.

The thickness 126 of the plate $110_2$ may be in a range of about 200 um to about 900 um. Alternatively, the thickness 126 of the plate $110_2$ may be less than about 200 um or greater than about 900 um.

Figure 3:
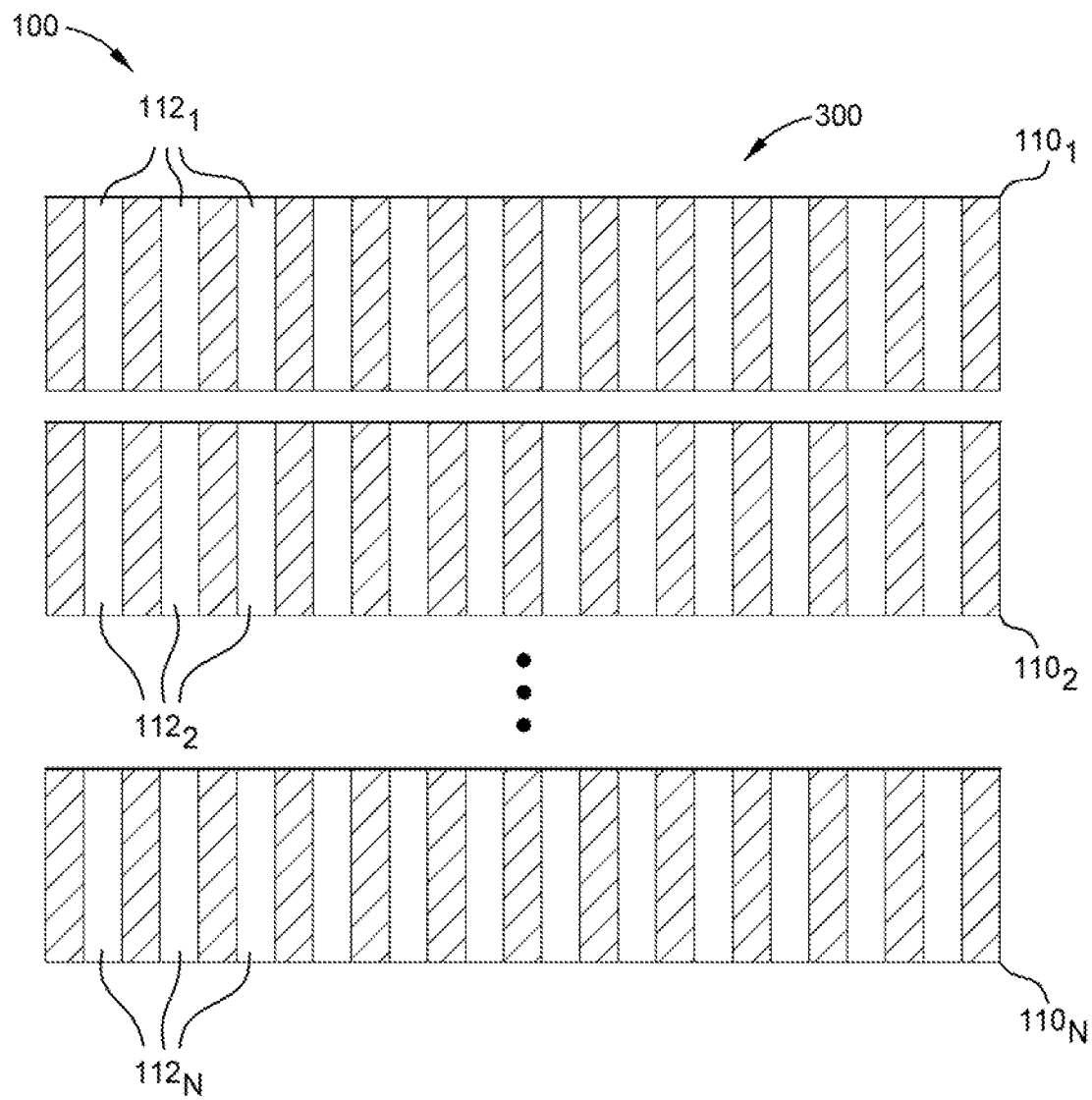
FIG. 3 is a schematic cross-sectional view of gas distribution plate, according to one or more embodiments.

The gas distribution plate 100 and the plates $110_1$, $110_2$ may have a circular shape. For example, the gas distribution plate 100 may have a circular shape with a diameter in a range of about 200 mm to about 350 mm. Alternatively, the gas distribution plate 100 may have a diameter of less than about 200 mm or greater than about 350 mm. Further, the gas distribution plate 100 may have other shapes than a circular shape. For example, the gas distribution plate 100 may have an elliptical shape or a rectangular shape, among others. Further, while the gas distribution plate 100 is shown as including 2 plates, e.g., plate $110_1$ and plate $110_2$, the gas distribution plate 100 may include more than 2 plates. For example, as is illustrated in FIG. 3, the gas distribution plate 100 may include $110_N$ plates, where N is greater than 2. Further, the total thickness of the gas distribution plate 100 may be about 25.4 mm. Alternatively, the total thickness of the gas distribution plate 100 may be less than about 25.4 mm or greater than about 25.4 mm.

The plates $110_1$, $110_2$ may be joined together to form the gas distribution plate 100. For example, as is illustrated in FIG. 2A, the plates $110_1$, $110_2$ may be joined together, forming the gas distribution plate 100 and a plurality of interconnected holes 212.

Figure 2A:
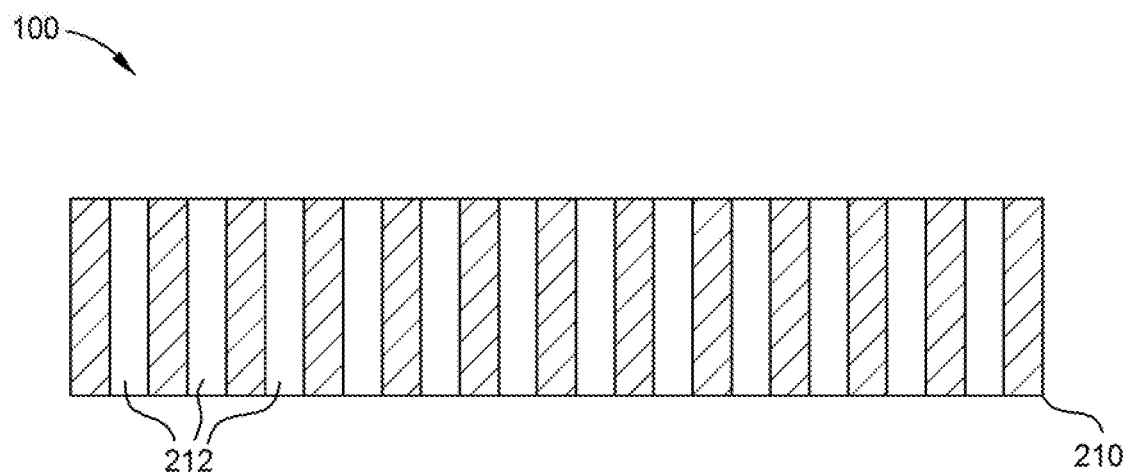

FIG. 2A illustrates the gas distribution plate 100, according to an embodiment. The gas distribution plate 100 of FIG. 2A includes a combined plate 210 that is formed by joining or coupling the plates $110_1$, $110_2$ together such that each of the holes $112_1$ is aligned with a respective one of the holes $112_2$. Aligning each of the holes $112_1$ with respective ones the holes $112_2$ forms a plurality of interconnected holes 212. Each of the interconnected holes 212 is formed from one of the holes $112_1$ and one of the holes $112_2$. Further, each of the interconnected holes 212 may be isolated from each other interconnected hole. For example, a processing gas may flow through each of the interconnected holes 212 but not between the interconnected holes 212. Further, each of the interconnected holes 212 may be same shape and/or size.

The combined plate 210 may be formed from a number of plates greater than 2. For example, the combined plate 210 may be formed from of at least N plates, where N is 3 or more. The combined plate 210 may be formed from at least 10 plates. Further, the combined plate 210 may be formed from at least 100 plates.

Figure 2B:
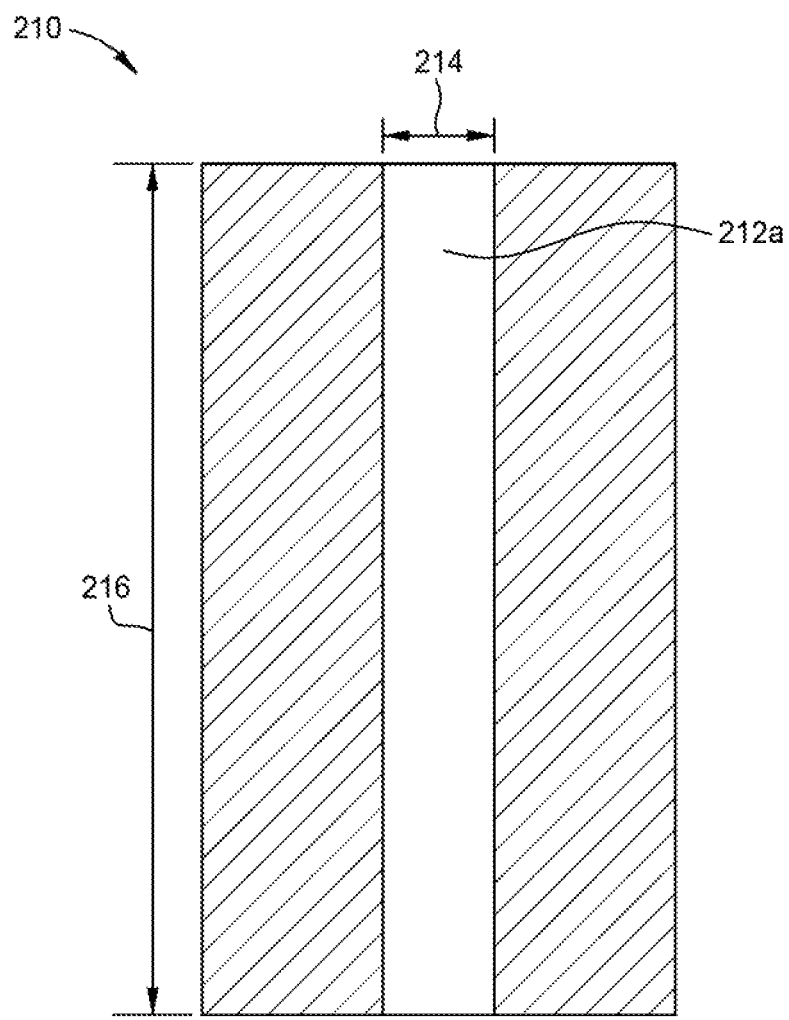
FIG. 2B is a schematic side view of a portion of a gas distribution plate, according to one or more embodiments.

FIG. 2B illustrates a portion of a combined plate 210, according to one or more embodiments. The interconnected hole 212a has a diameter 214 and a height 216. Further, an aspect ratio of the interconnected hole 212 may be based on a ratio of the height 216 to the diameter 214. For example, the interconnected hole 212a may have an aspect ratio of at least about 50 to 1. Alternatively, the interconnected hole 212a may have an aspect ratio of less than about 50 to 1 or greater than about 50 to 1. Further, the interconnected hole 212a may have an aspect ratio of about 25 to 1. Additionally, each of interconnected holes 212 may have about the same aspect ratio.

The diameter of each of the interconnected holes 212 may be substantially uniform. For example, at any point of an interconnected hole the diameter is the same, or within a manufacturing tolerance, of any other point of the interconnected hole. Stated another way, the aspect ratio of each interconnected holes is uniform or substantially similar (e.g., within a manufacturing tolerance) throughout the entirety of each interconnected hole. Further, the diameter of each interconnected hole 212 at a first side (e.g., surface) of the combined plate 210 is the same as the diameter of each interconnected hole 212 at a second side (e.g., surface) of the combined plate 210.

FIG. 3 illustrates the gas distribution plate 100, according to one or more embodiments. The gas distribution plate 100 of FIG. 3 includes the combined plate 300 formed by joining the plate $110_1$, the plate $110_2$, and a plate $110_N$, where N is greater than 2. Further, the holes $112_1$ of the plate $110_1$, the holes $112_2$ of the plate $110_2$, and the holes 112N of the plate $110_N$ are aligned to generate a plurality of interconnected holes.

Figure 4A:
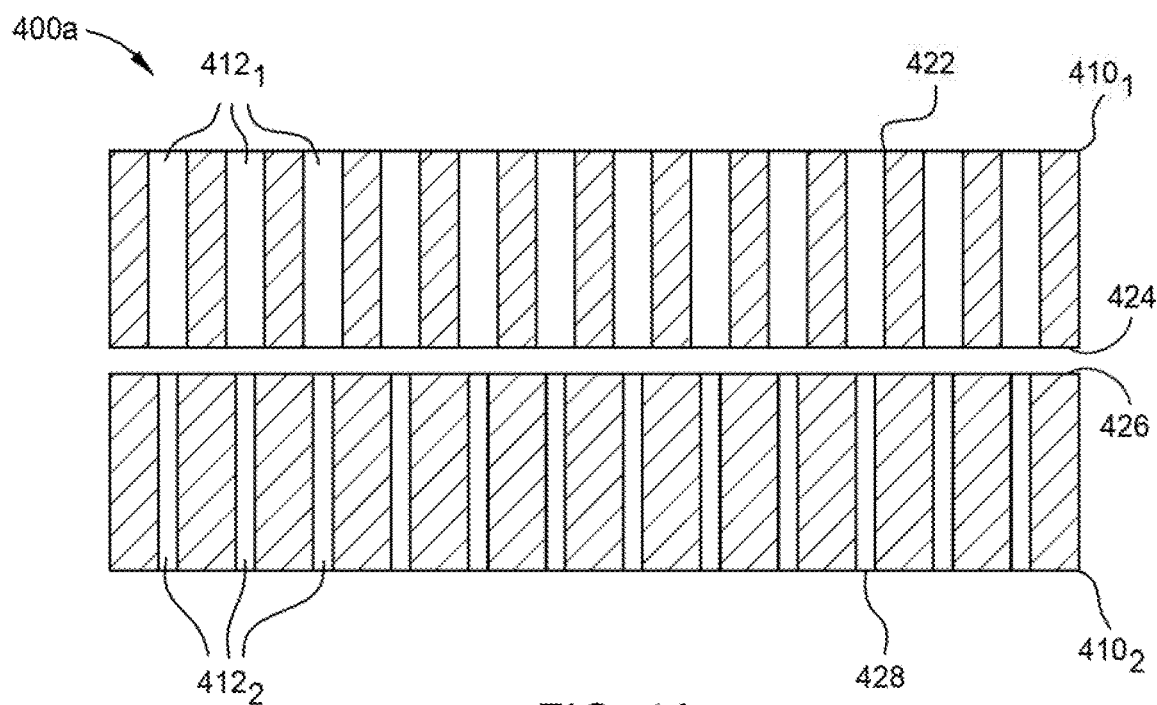

FIG. 4A illustrates plates $410_1$ and $410_2$ of a gas distribution plate 400a, according to one or more embodiments. While two plates are illustrated in the embodiment of FIG. 4A, alternatively, the gas distribution plate 400b may include three or more plates. Further, the plate $410_1$ may be bonded to the plate $410_2$ forming the gas distribution plate 400a. Additionally, the gas distribution plate 400a may be part of a showerhead assembly, e.g., the showerhead assembly 616 of FIG. 6.

The plate $410_1$ includes holes $412_1$ and may be formed similar to that of plate $110_1$ and $110_2$. Further, the plate $410_2$ includes holes $412_2$ and may be formed similar to that of plate $110_1$ and $110_2$.

The diameter of each of the holes $412_2$ may differ from the diameter from the diameter of each of the holes $412_1$. For example, the diameter of the holes $412_1$ along surface 424 of the plate $410_1$ is larger than the diameter of the holes $412_2$ along the surface 426 of the plate $410_2$. Further, the diameter of the holes $412_2$ along the surface 426 may be the same or may differ from the diameter of the holes $412_2$ along the surface 428. For example, the diameter of the holes $412_2$ along the surface 426 may be larger or smaller than the diameter of the holes $412_2$ along the surface 428.

Utilizing plates having holes with different diameters may aid in the alignment of the plates before bonding to the plates together. For example, utilizing holes of different diameter allow for slight offsets in alignment of the holes while maintaining a similar cross section area for the gas flow as compared to utilizing holes of a common diameter which are fully aligned with each other.

Figure 4B:
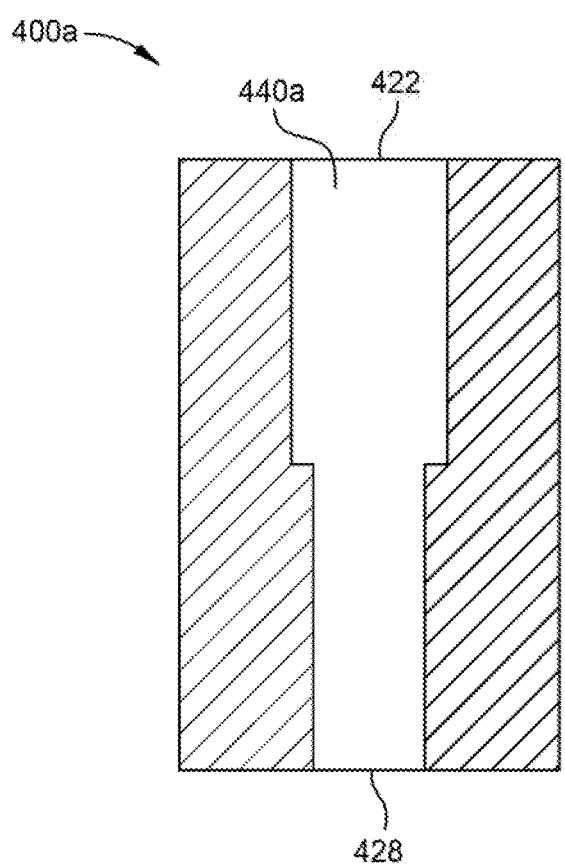

FIG. 4B illustrates a portion of gas distribution plate 400a, according to one or more embodiments. In particular, FIG. 4B illustrates an interconnected hole 440a of gas distribution plate 400a formed after bonding the plate $410_1$ with the plate $410_2$. For example, the interconnected hole 440a is formed by joining the plate $410_1$ with the plate $410_2$, and comprises one of holes $412_1$ and one of holes $412_2$. Further, the diameter of interconnected hole 440 is non-uniform (i.e., a non-uniform diameter). For example, the diameter of the interconnected hole 440a along the surface 422 differs from the diameter of the interconnected hole 440 along the side 428. As illustrated in FIG. 4B, the diameter of the interconnected hole 440a along the surface 422 is larger than the diameter of the interconnected hole 440a along the surface 428. Alternatively, the diameter of the interconnected hole 440a along the surface 422 may be smaller than the diameter of the interconnected hole 440a along the surface 428.

Figure 4C:
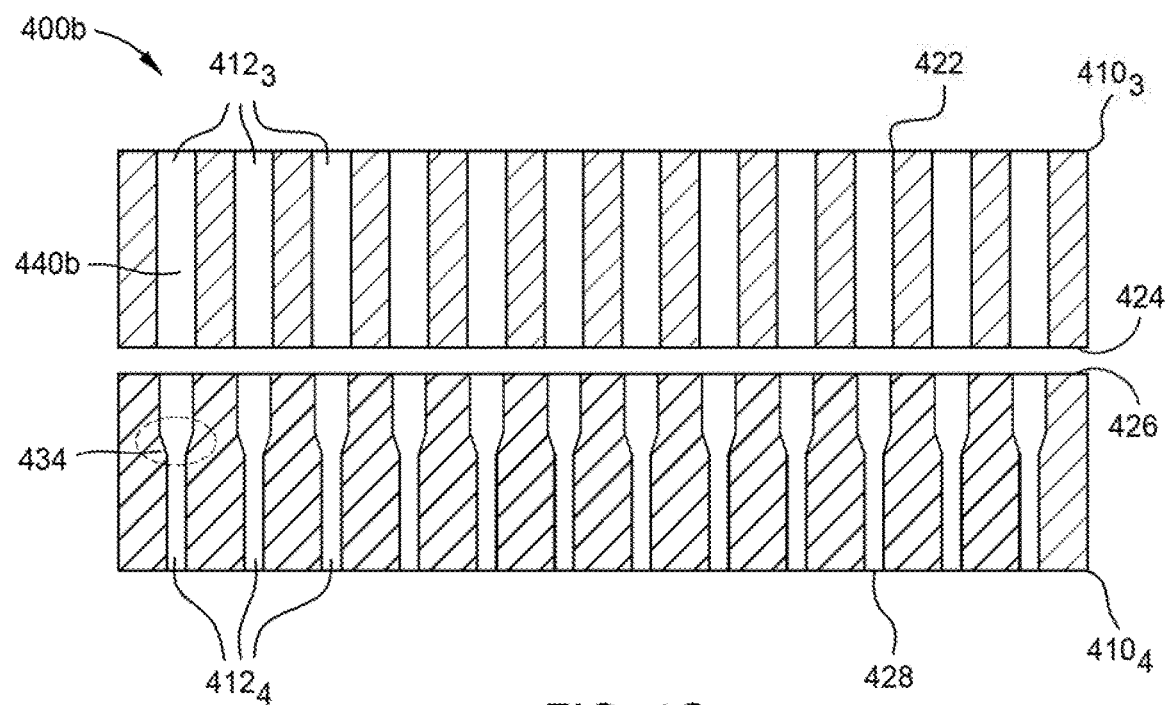

FIG. 4C illustrates plates $410_3$ and $410_4$ of a gas distribution plate 400b, according to one or more embodiments. While two plates are illustrated in the embodiment of FIG. 4C, alternatively, the gas distribution plate 400b may include three or more plates. Further, the plate $410_3$ may be bonded to the plate $410_4$ forming the gas distribution plate 400b. Additionally, the gas distribution plate 400b may be part of a showerhead assembly, e.g., the showerhead assembly 616 of FIG. 6.

The plate $410_3$ includes holes $412_3$ and may be formed similar to that of plate $110_1$ and $110_2$. The plate $410_4$ includes holes $412_4$ and may be formed similar to that of plate $110_1$ and $110_2$.

Similar to that of plates $410_1$ and $410_2$, the diameter of each of the holes $412_3$ may differ from the diameter from the diameter of each of the holes $412_4$. However, the holes $412_3$ and/or the holes $412_4$ may include a tapered region. For example, the holes $412_4$ include a tapered region 434. Accordingly, the diameter of the holes $412_4$ is non-uniform. For example, the diameter of the holes $412_4$ along the surface 426 is larger than the diameter of the holes $412_4$ along surface 428. Additionally, or alternatively, the diameter of the holes $412_3$ may be non-uniform. For example, the diameter of the holes $412_3$ along one of the surfaces 422 and 424 may differ from the diameter of the holes $412_3$ along the other one of the surfaces 422 and 424. Further, the holes $412_3$ may include a tapered region.

Figure 4D:
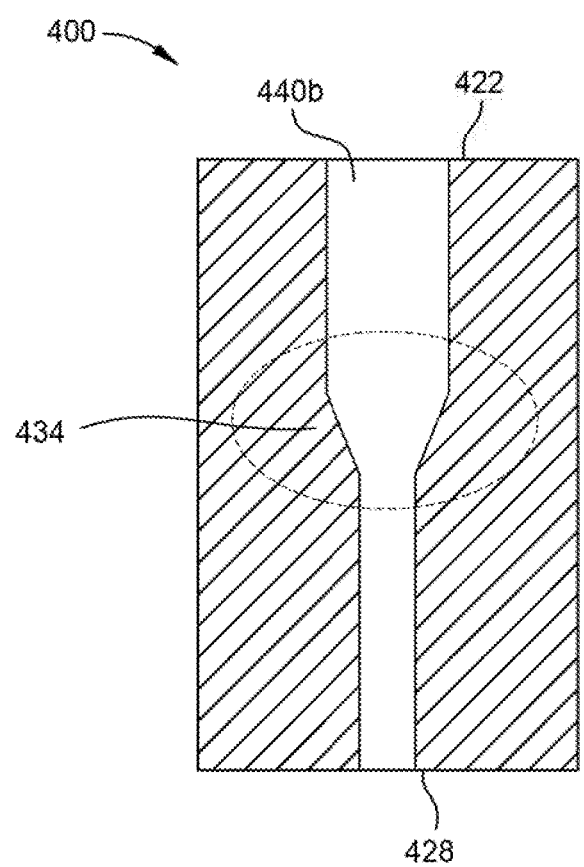

FIG. 4D illustrates a portion of gas distribution plate 400b, according to one or more embodiments. In particular, FIG. 4D illustrates an interconnected hole 440b of gas distribution plate 400b formed after bonding the plate $410_3$ with the plate $410_4$. For example, the interconnected hole 440a is formed by joining the plate $410_3$ with the plate $410_4$, and comprises one of holes $412_3$ and one of holes $412_4$. Accordingly, the diameter of interconnected hole 440b is non-uniform, differing between surface 422 and surface 428, and the interconnected hole 440b includes a tapered region 434. The diameter of the interconnected hole 440b along surface 422 may be larger or smaller than the diameter of the interconnected hole 440b along surface 428.

FIG. 4E illustrates an interconnected hole 440c, according to one or more embodiments. The interconnected hole 440c may be formed from holes in two or more plates as illustrated in the embodiments of FIGS. 1, 3, 4A and/or 4C and described in the corresponding description. As illustrated in FIG. 4E, the interconnected hole 440c includes a tapered region 444 disposed along the surface 422. Further, the diameter of the interconnected hole 440c is non-uniform, varying between the surface 422 and 428.

FIG. 4F illustrates an interconnected hole 440d, according to one or more embodiments. The interconnected hole 440d may be formed from holes in two or more plates as illustrated in the embodiments of FIGS. 1, 3, 4A and/or 4C and described in the corresponding description. As illustrated in FIG. 4F, the interconnected hole 440d includes a tapered region 454 disposed along the surface 422 and tapered region 456 disposed between the surface 422 and 428. Further, the diameter of the interconnected hole 440d is non-uniform, varying between the surface 422 and 428.

FIG. 4G illustrates an interconnected hole 440e, according to one or more embodiments. The interconnected hole 440e may be formed from holes in two or more plates as illustrated in the embodiments of FIGS. 1, 3, 4A and/or 4C and described in the corresponding description. As illustrated in FIG. 4G, the interconnected hole 440e includes a tapered regions 464 disposed along the surface 422 and tapered region 466 disposed along the surface 428. Further, the diameter of the interconnected hole 440e is non-uniform, varying between the surface 422 and 428. The diameter of the interconnected hole 440e along the surface 422 may be similar to (e.g., within a manufacturing tolerance) the diameter of the interconnected hole 440e along surface 428. Alternatively, the diameter of the interconnected hole 440e along the surface 422 differs from the diameter of the interconnected hole 440e along surface 428. For example, the diameter of the interconnected hole 440e along the surface 422 is greater than or less than the diameter of the interconnected hole 440e along surface 428.

FIG. 4H illustrates an interconnected hole 440f, according to one or more embodiments. The interconnected hole 440f may be formed from holes in two or more plates as illustrated in the embodiments of FIGS. 1, 3, 4A and/or 4C and described in the corresponding description. As illustrated in FIG. 4H, the interconnected hole 440f includes a tapered region 474 disposed along the surface 428. Further, the diameter of the interconnected hole 440f is non-uniform, varying between the surface 422 and 428.

FIG. 4I illustrates an interconnected hole 440e, according to one or more embodiments. The interconnected hole 440g may be formed from holes in two or more plates as illustrated in the embodiments of FIGS. 1, 3, 4A and/or 4C and described in the corresponding description. As illustrated in FIG. 4I, the interconnected hole 440g includes a tapered region 484 disposed along the surface 422 and tapered region 486 disposed along the surface 428. Further, the diameter of the interconnected hole 440g is non-uniform, varying between the surface 422 and 428. In one or more embodiments, the diameter of the interconnected hole 440g along the surface 422 is greater than the diameter of the interconnected hole 440g along surface 428. Alternatively, the diameter of the interconnected hole 440g along the surface 428 may be greater than the diameter of the interconnected hole 440g along surface 422.

Figure 5:
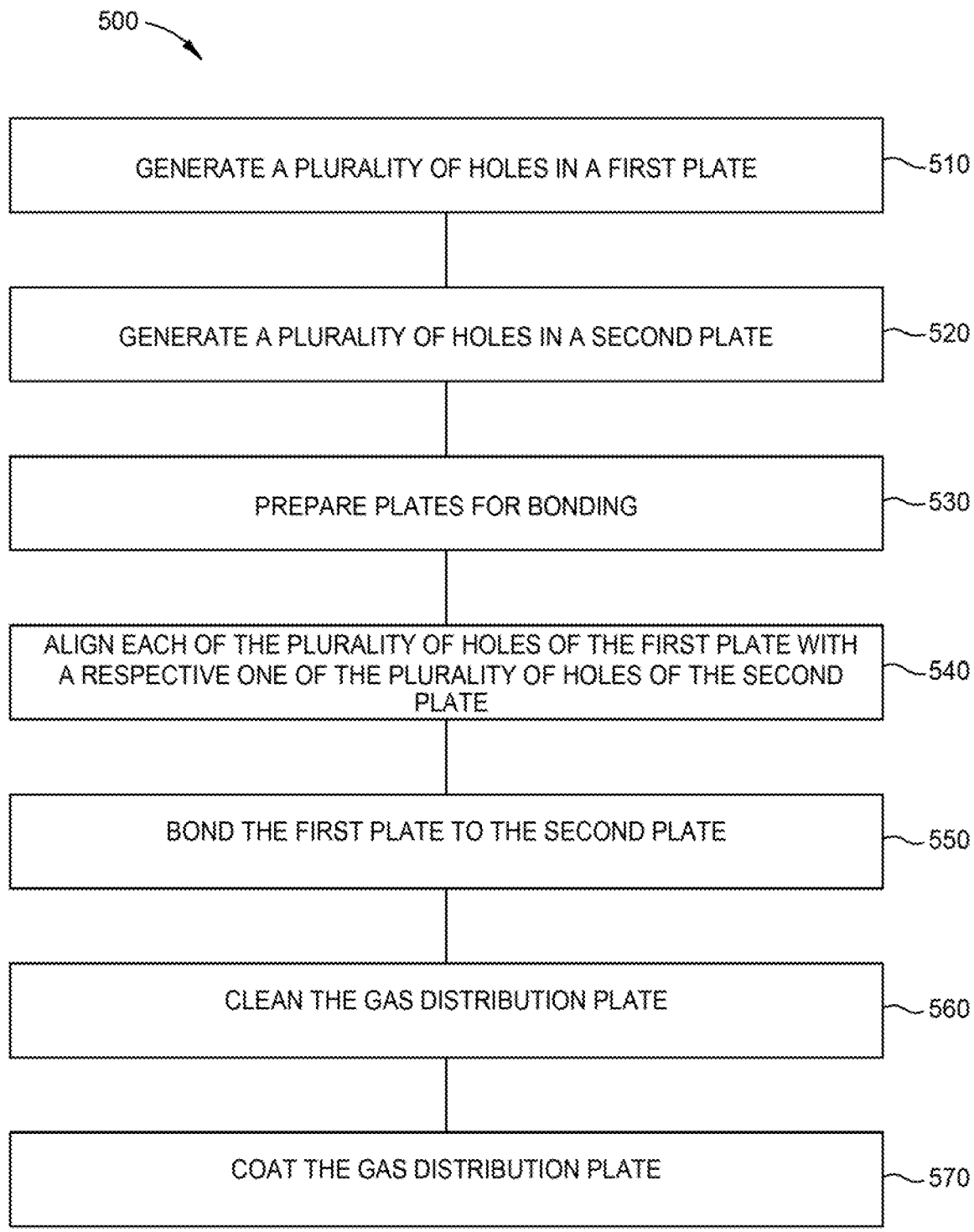
FIG. 5 illustrates a flow chart of a method for forming a gas distribution plate, according to one or more embodiments.

The plates $110_1$, $110_2$, $110_N$ may be bonded using any method suitable for bonding the plates without damaging the plates and while maintaining an independence between the interconnected holes. For example, FIG. 5 illustrates a flowchart of a method for bonding plates to generate a gas distribution plate 100, according to one or more embodiments. At operation 510, a plurality of holes is generated in a first plate. For example, as is shown in FIG. 1, the holes $112_1$ are generated in plate $110_1$. The holes $112_1$ may be generated through a process of mechanical drilling, ultrasonic drilling, laser drilling, electro-discharge machining, or any other subtractive fabrication method.

At operation 520, a plurality of holes is generated in a second plate. For example, as is shown in FIG. 1, the holes $112_2$ are generated in the plate $110_2$. The holes $112_1$ may be generated through a process of mechanical drilling, ultrasonic drilling, laser drilling, electro-discharge machining, or any other subtractive fabrication method. Further, a similar method may be used to generate holes in any number of plates.

At operation 530, the plates are prepared for bonding. For example, the surfaces of plates 110 and 410 may be prepared for bonding to ensure that the surfaces are flat and clean to facilitate proper bonding of the plates. Preparing the surfaces for bonding may include one or more of polishing the surfaces, lapping the surfaces, cleaning the surfaces, and etching the surfaces, among others.

At operation 540, each of the plurality holes of the first plate is aligned with a respective one of the plurality of holes of the second plate. For example each of the holes $112_1$ may be aligned with a respective one of the holes $112_2$ forming a plurality of interconnected holes 212. Further, in embodiments where more than two plates are utilized to form a combined plate, the holes from any two plates may be aligned to form a plurality interconnected holes. Each of the interconnected holes may be formed from a hole from each of the plates utilized to form the gas distribution plate 100.

At operation 550, the first plate is bonded with the second plate. For example, the plates may be together using a brazing method (i.e., brazing technique), or a diffusion bonding method (i.e., a diffusion bonding technique), among others.

In a brazing method, the holes are aligned, the plates are stacked and a braze, or filler, sheet may be disposed and sandwiched between the plates. For example, the plate $110_1$ may be stacked with plate $110_2$ and each of the holes $112_1$ may be aligned with a respective one of the holes $112_2$. Additionally, after the braze sheets are placed on a plate and before the plates are stacked, the portions of the braze sheets that may be overlapping a hole in the corresponding plate may be removed. After alignment of the plates $110_1$ and $110_2$, the brazing process may be completed. For example, temperature at or above the melting temperature of the braze sheets may be applied to the gas distribution plate 100, to melt the braze sheets and join the plate $110_1$ with the plate $110_2$.

In a diffusion bonding method, each plate of the gas distribution plate 100 may be stacked and the holes of each plate may be aligned. For example, the plate $110_1$ may be stacked with plate $110_2$ and each of the holes $112_1$ may be aligned with a respective one of the holes $112_2$. After stacking the plates and aligning the holes, the diffusing bonding process may be completed. Further, aligning the holes may include orienting the plates such that the rolling directions of the raw material of each of the plates are aligned. Orienting the rolling directions of the plates may ensure that any mismatches in material properties based on the direction of the raw material for plates does not impact the bonding and performance of the gas distribution plate. The rolling direction may be parallel to the structural lines on the surface of the plates created during as a result of the manufacture process utilized to crate the plates.

At operation 560, the gas distribution plate formed by bonding the first and second plates is cleaned. For example, in one embodiment, after the completion of the boding process, the gas distribution plate may be cleaned using any suitable chemical cleaning process. At operation 570, the gas distribution plate 100, 400 may be coated with an oxide, forming a coating on the gas distribution plate, using an atomic layer deposition (ALD) method, or any other process that is able to deposit a layer on the gas distribution plate 100, 400 such that a processing gas may still pass through the interconnected holes. For example, the gas distribution plate 100, 400 may be coated within an oxide, such as Aluminum oxide or Yttrium oxide, among others.

Figure 6:
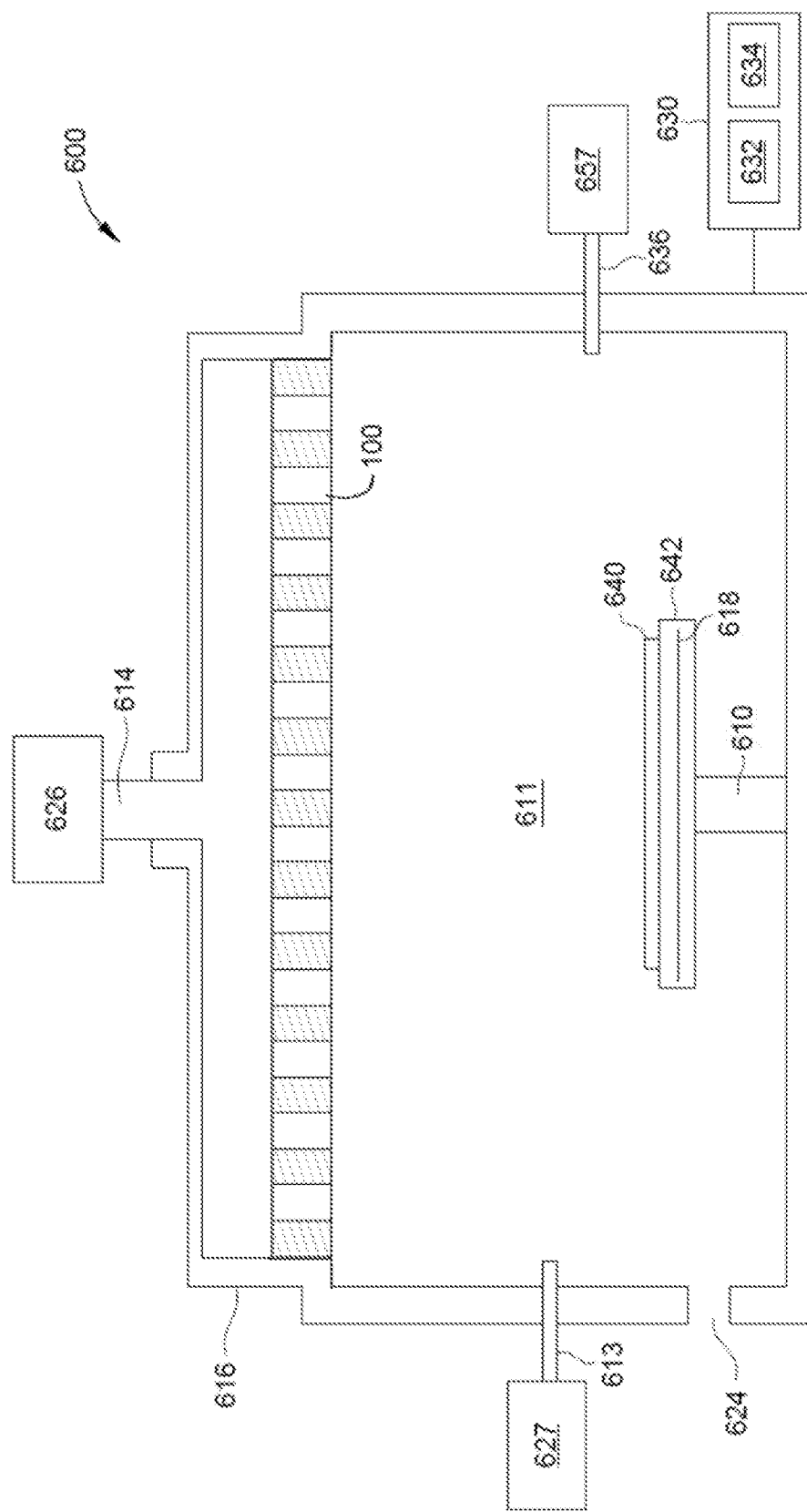
FIG. 6 is a schematic side view of a process chamber, according to one or more embodiments.

FIG. 6 illustrates a schematic sectional view of a processing chamber 600 according to one embodiment. The processing chamber 600 may be used to process one or more substrates 640 therein, including the processes of depositing a material on the substrate 640, heating of the substrate 640, etching of the substrate 640, or combinations thereof. The processing chamber 600 may be an atomic layer deposition (ALD) chamber. Further, the processing chamber 600 may be a chemical vapor deposition (CVD) processing chamber, a plasma-enhanced chemical vapor deposition (PECVD) processing chamber, or a physical vapor deposition (PVD) processing chamber, among others.

In one or more embodiments, the processing chamber 600 has an internal region 611 that includes a substrate support 642 disposed therein to support a substrate 640. The substrate support 642 includes a heating element 618 and an element that retains the substrate 640 on a top surface of the substrate support 642, such as an electrostatic chuck, a vacuum chuck, a substrate retaining clamp, or the like. The substrate support 642 may be coupled to and movably disposed in the internal region 611 by a stem 610 connected to a lift system that moves the substrate support 642 between an elevated processing position and a lowered position that facilitates transfer of the substrate 640 to and from the processing chamber 600 through an opening 624.

The processing chamber 600 may include a gas supply source 626. In one or more embodiment, the gas supply source 626 may include a mass flow control (MFC) device, disposed between a gas source and the internal region 611 to control a flow rate of process gas or gasses from the gas source to the gas distribution plate 100 of a showerhead assembly 616 used for distributing the process gasses across the internal region 611. For example, the process gas may flow through gas inlet 614 and through the holes of the gas distribution plate 100. The showerhead assembly 616 is coupled to the processing chamber 600. For example, the showerhead assembly 616 may be coupled to the processing chamber 600 to position the gas distribution plate 100 above the substrate 640. The gas distribution plate 100 may be centered over the substrate 640. Further, the gas distribution plate 100 may be larger than the substrate 640 such that the edges of the gas distribution plate 100 extend beyond the edges of the substrate 640. The showerhead assembly 616 may be connected to a RF power source for generating a plasma in the internal region 611 from a process gasses. Moreover, a deposition process may be utilized to process the substrate 640 at a processing pressure to deposit or grow a film onto the substrate 640.

The stem 610 is configured to move the substrate support 642 to an elevated processing position to process the substrate 640. Further, a vacuum pump 657 may be coupled to the internal region 611 and control the pressure within the internal region 611.

A process gas, such as a deposition gas or cleaning chemistry, may be supplied from a gas supply source 627 into the internal region 611 through the gas inlet 613 of the processing chamber 600. Further, the process gas may exit the process gas region through the gas outlet 636. Removal of the process gas, including cleaning chemistry, through the gas outlet 636 is facilitated by a vacuum pump 657 coupled to the gas outlet 636.

The above-described processing chamber 600 can be controlled by a processor based system controller, such as controller 630. For example, the controller 630 is configured to control flow of various precursor gases, process gases, and purge gases, during different operations of a substrate processing sequence. By way of further example, the controller 630 is configured to control feeding of gases, lamp operation, or other process parameters, among other controller operations.

The controller 630 is generally used to facilitate the control and automation of the components within the processing chamber 600. The controller 630 can be, for example, a computer, a programmable logic controller, or an embedded controller. The controller 630 typically includes a central processing unit (CPU) 632 memory 634, and support circuits for inputs and outputs (I/O). The CPU 632 may be one of any form of computer processors that are used in industrial settings for controlling various system functions, substrate movement, chamber processes, and control support hardware (e.g., sensors, motors, heaters, etc.), and monitor the processes performed in the processing chamber 600. The memory 634 is connected to the CPU 632, and may be one or more of a readily available non-volatile memory, such as random access memory (RAM), flash memory, read only memory (ROM), floppy disk, hard disk, or any other form of digital storage, local or remote. Software instructions and data can be coded and stored within the memory for instructing the CPU 632. The support circuits are also connected to the CPU 632 for supporting the processor in a conventional manner. The support circuits may include cache, power supplies, clock circuits, input/output circuitry, subsystems, and the like. A program (e.g., software routine or computer instructions) readable by the controller 630 determines which tasks are performable by the components in the processing chamber 600. Preferably, the program is software readable by the processor within the controller 630 that includes code to perform tasks relating to monitoring, execution and control of the delivery and control of the process variables utilized in one or more the processes performed within the processing chamber 600, and the movement, support, and/or positioning of the substrate 640 and other components within the processing chamber 600 along with the various process tasks and various sequences being controlled the by controller 630.

A gas distribution plate may be formed to increase in the uniformity of the process gas applied to a substrate during processing of the substrate. The gas distribution plate may be formed by joining two or more plates together. Each of the plates may have a plurality of holes formed therein, and each of the holes in a first one of the plates is aligned with a respective hole in a second one of the plates. When the plates are joined, the aligned holes form a plurality of interconnected holes. Further, by forming the holes in thinner plates which are joined to generate the gas distribution plate, the holes may have a higher aspect ratio than if the holes were formed in a thicker gas distribution plate formed from a single plate. Further, the number of holes that may be formed in each plate may be greater than the total number of holes that may be formed in a gas distribution plate formed from a single plate.

While the foregoing is directed to embodiments of the present invention, other and further embodiments of the invention may be devised without departing from the basic scope thereof, and the scope thereof is determined by the claims that follow.

What is claimed is:

1. A gas distribution plate for a showerhead assembly, the gas distribution plate comprising:
   a first plate comprising a first plurality of holes, wherein each of the first plurality of holes has a diameter of at least 100 um; and
   a second plate coupled to the first plate, the second plate comprising a second plurality of holes, each of the second plurality of holes has a diameter of at least 100 um, wherein each of the first plurality of holes is aligned with a respective one of the second plurality of holes forming a plurality of interconnected holes, wherein each of the plurality of interconnected holes is isolated from each other of the plurality of interconnected holes;
   wherein the coupled first and second plates form a structure including a top surface and a bottom surface; and wherein each interconnected hole comprises:
a first diameter at the top surface;
a first frustoconical taper from the first diameter to a smaller second diameter;
a transition from the second diameter to a smaller third diameter below the first frustoconical taper, the transition including a step change in hole diameter; and
the third diameter at the bottom surface.

2. The gas distribution plate of claim 1, wherein each of the plurality of interconnected holes has an aspect ratio of at least 25 to 1.

3. The gas distribution plate of claim 1, wherein each of the first plurality of holes and each of the second plurality of holes has a diameter of about 100 um to about 600 um.

4. The gas distribution plate of claim 1, wherein the first plate and the second plate has a thickness in a range about 100 um to about 12.7 mm.

5. The gas distribution plate of claim 1, wherein the gas distribution plate further comprises a third plate coupled to the second plate, the third plate comprising a third plurality of holes, wherein each of the third plurality of holes is aligned with a respective one of the first plurality of holes and a respective one of the second plurality of holes.

6. The gas distribution plate of claim 1, wherein the first plate is bonded to the second plate using one of a diffusion bonding technique and a brazing technique.

7. A processing chamber comprising:
a showerhead assembly comprising:
a gas distribution plate comprising:
a first plate comprising a first plurality of holes, wherein each of the first plurality of holes has a diameter of at least 100 um;
a second plate coupled to the first plate, the second plate comprising a second plurality of holes, each of the second plurality of holes has a diameter of at least 100 um, wherein each of the first plurality of holes is aligned with a respective one of the second plurality of holes forming a plurality of interconnected holes, wherein each of the plurality of interconnected holes is isolated from each other of the plurality of interconnected holes;
wherein the coupled first and second plates form a structure including a top surface and a bottom surface;
wherein each interconnected hole comprises:
a first diameter at the top surface;
a first frustoconical taper from the first diameter to a smaller second diameter;
a transition from the second diameter to a smaller third diameter below the first frustoconical taper, the transition including a step change in hole diameter; and
the third diameter at the bottom surface;
a substrate support configured to support a substrate; and
a gas supply fluidly coupled with the showerhead assembly and configured to provide a process gas to the showerhead assembly.

8. The processing chamber of claim 7, wherein each of the plurality of interconnected holes has an aspect ratio of at least 25 to 1.

9. The gas distribution plate of claim 1, wherein the step change in hole diameter corresponds to an interface of a lower surface of the first plate and an upper surface of the second plate.

10. The gas distribution plate of claim 9, wherein the transition from the second diameter to the third diameter further includes a second frustoconical taper between the upper surface of the second plate and the bottom surface of the structure.

11. The gas distribution plate of claim 10, wherein:
each interconnected hole further comprises a fourth diameter at the upper surface of the second plate, the fourth diameter smaller than the second diameter and larger than the third diameter; and
the second frustoconical taper extends from the fourth diameter to the third diameter.

12. The gas distribution plate of claim 11, wherein each interconnected hole further comprises:
a first portion of uniform diameter equal to the second diameter and extending from the first frustoconical taper to the transition; and
a second portion of uniform diameter equal to the third diameter and extending from the transition to the bottom surface.

13. The gas distribution plate of claim 1, wherein each interconnected hole further comprises a first portion of uniform diameter equal to the second diameter and extending from the first frustoconical taper to the transition.

14. The gas distribution plate of claim 13, wherein each interconnected hole further comprises a second portion of uniform diameter equal to the third diameter and extending from the transition to the bottom surface.

15. The processing chamber of claim 7, wherein the step change in hole diameter corresponds to an interface of a lower surface of the first plate and an upper surface of the second plate.

16. The processing chamber of claim 15, wherein the transition from the second diameter to the third diameter further includes a second frustoconical taper between the upper surface of the second plate and the bottom surface of the structure.

17. The processing chamber of claim 16, wherein:
each interconnected hole further comprises a fourth diameter at the upper surface of the second plate, the fourth diameter smaller than the second diameter and larger than the third diameter; and
the second frustoconical taper extends from the fourth diameter to the third diameter.

18. The processing chamber of claim 17, wherein each interconnected hole further comprises:
a first portion of uniform diameter equal to the second diameter and extending from the first frustoconical taper to the transition; and
a second portion of uniform diameter equal to the third diameter and extending from the transition to the bottom surface.

19. The processing chamber of claim 7, wherein each interconnected hole further comprises a first portion of uniform diameter equal to the second diameter and extending from the first frustoconical taper to the transition.

20. The processing chamber of claim 19, wherein each interconnected hole further comprises a second portion of uniform diameter equal to the third diameter and extending from the transition to the bottom surface.

* * * * *